(12) United States Patent
Nakashima

(10) Patent No.: US 12,289,090 B2
(45) Date of Patent: Apr. 29, 2025

(54) FILTER DEVICE, AND HIGH-FREQUENCY FRONT END CIRCUIT AND DIPLEXER THAT ARE EQUIPPED WITH THE FILTER DEVICE

(71) Applicant: Murata Manufacturing Co., Ltd., Nagaokakyo (JP)

(72) Inventor: Yasuhiro Nakashima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 224 days.

(21) Appl. No.: 18/116,989

(22) Filed: Mar. 3, 2023

(65) Prior Publication Data

US 2023/0208041 A1 Jun. 29, 2023

Related U.S. Application Data

(63) Continuation of application No. PCT/JP2021/036748, filed on Oct. 5, 2021.

(30) Foreign Application Priority Data

Oct. 22, 2020 (JP) ................. 2020-177344

(51) Int. Cl.
*H03H 7/46* (2006.01)
*H01F 27/28* (2006.01)
(Continued)

(52) U.S. Cl.
CPC ......... *H03H 7/463* (2013.01); *H01F 27/2871* (2013.01); *H01F 27/29* (2013.01);
(Continued)

(58) Field of Classification Search
CPC ......... H03H 2001/0085; H03H 7/0115; H03H 7/09; H03H 7/1766; H03H 7/463
(Continued)

(56) References Cited

U.S. PATENT DOCUMENTS

2002/0030561 A1 3/2002 Masuda et al.
2003/0043759 A1 3/2003 Yamaguchi
(Continued)

FOREIGN PATENT DOCUMENTS

JP 2003158437 A 5/2003
JP 3702767 B2 10/2005
(Continued)

OTHER PUBLICATIONS

International Search Report in PCT/JP2021/036748, mailed on Dec. 14, 2021, 3 pages.
(Continued)

*Primary Examiner* — Rakesh B Patel
(74) *Attorney, Agent, or Firm* — Keating & Bennett, LLP

(57) ABSTRACT

A filter device includes a main body, a first inductor, a second inductor, and a third inductor that are provided in the main body to transfer signals from an antenna terminal to a first terminal. The first inductor is connected to the antenna terminal and the second inductor is connected to the first terminal. The third inductor is connected to a signal transfer path between the first inductor and the second inductor. In a plan view from a normal direction of the main body, the first inductor and the second inductor are adjacent to each other.

20 Claims, 9 Drawing Sheets

(51) Int. Cl.
  *H01F 27/29* (2006.01)
  *H03H 7/01* (2006.01)
  *H03H 1/00* (2006.01)

(52) U.S. Cl.
  CPC ........ *H03H 7/0115* (2013.01); *H03H 7/1766* (2013.01); *H03H 2001/0085* (2013.01)

(58) Field of Classification Search
  USPC .................................................. 333/175, 185
  See application file for complete search history.

(56) References Cited

U.S. PATENT DOCUMENTS

| | | | |
|---|---|---|---|
| 2010/0171568 A1* | 7/2010 | Taniguchi | H03H 7/09 333/176 |
| 2011/0074521 A1 | 3/2011 | Chernyakov et al. | |
| 2013/0229241 A1 | 9/2013 | Imamura | |
| 2013/0241672 A1 | 9/2013 | Tamaru et al. | |
| 2017/0244374 A1* | 8/2017 | Yoshida | H01P 5/16 |
| 2019/0245506 A1 | 8/2019 | Masuda | |
| 2020/0287512 A1* | 9/2020 | Saito | H03H 7/1775 |
| 2021/0194452 A1 | 6/2021 | Tsukamoto et al. | |
| 2021/0257984 A1 | 8/2021 | Sato et al. | |

FOREIGN PATENT DOCUMENTS

| | | |
|---|---|---|
| JP | 2011523523 A | 8/2011 |
| JP | 2021129274 A | 9/2021 |
| WO | 2012066873 A1 | 5/2012 |
| WO | 2012077498 A1 | 6/2012 |
| WO | 2018083936 A1 | 5/2018 |
| WO | 2020054284 A1 | 3/2020 |

OTHER PUBLICATIONS

Written Opinion in PCT/JP2021/036748, mailed on Dec. 14, 2021, 4 pages.

* cited by examiner

FILTER DEVICE, AND HIGH-FREQUENCY FRONT END CIRCUIT AND DIPLEXER THAT ARE EQUIPPED WITH THE FILTER DEVICE

CROSS REFERENCE TO RELATED APPLICATIONS

This application claims the benefit of priority to Japanese Patent Application No. 2020-177344 filed on Oct. 22, 2020 and is a Continuation Application of PCT Application No. PCT/JP2021/036748 filed on Oct. 5, 2021. The entire contents of each application are hereby incorporated herein by reference.

BACKGROUND OF THE INVENTION

1. Field of the Invention

The present disclosure relates to a filter device, and a high-frequency front end circuit and a diplexer including the filter device and more particularly to techniques for adjustment of bandpass characteristics of the filter device.

2. Description of the Related Art

An LC filter circuit in which a parallel resonance trap circuit is connected in series between an LC parallel resonator and an input terminal and/or an output terminal is disclosed in Japanese Patent No. 3702767. In the LC filter circuit disclosed in Japanese Patent No. 3702767, an attenuation pole is generated in a vicinity of a center frequency of a pass band by the parallel resonance trap circuit and thus attenuation required for a desired frequency can be ensured.

SUMMARY OF THE INVENTION

In recent years, so-called multiband communication in which communication is carried out with the use of high-frequency signals in a plurality of frequency bands has been developed in communication standards of Wi-Fi and fifth generation mobile communication system (5G) or the like. In the multiband communication, it is necessary to ensure a frequency bandwidth in a specified pass band and to ensure attenuation in a non-pass band in order to avoid interference with an adjoining frequency band.

In order to selectively allow passage of high-frequency signals in a desired pass band in this manner, such a filter device as disclosed in Japanese Patent No. 3702767 is used. Herein, a technique of multi-staging an LC resonator and a technique of strengthening coupling among resonators by adding an inductor or the like have been known as techniques of adjusting a frequency bandwidth. In such an adjustment technique employing an additional element as described above, however, there is a possibility of increase in costs concomitant with increase in number of components or increase in device size.

Preferred embodiments of the present invention increase an adjustment allowance for a pass bandwidth with a comparatively simple configuration in a filter device including a plurality of inductors.

A filter device according to an example embodiment of the present disclosure includes a main body in which a plurality of dielectric layers are stacked and a first inductor, a second inductor, and a third inductor provided in the main body to transfer signals from an input terminal to an output terminal. The first inductor is connected to the input terminal and the second inductor is connected to the output terminal. The third inductor is connected to a signal transfer path between the first inductor and the second inductor. The first inductor and the second inductor are adjacent to each other in a plan view from a normal direction of the main body.

According to a filter device of an example embodiment of the present disclosure, the first inductor on an input side is adjacent to the inductor second inductor on an output side in the main body of the dielectric. Such a configuration increases the adjustment allowance for the strength of the magnetic coupling between the first inductor and the second inductor, compared with an arrangement of the first inductor and the second inductor with the third inductor interposed therebetween. Thus, the adjustment allowance for the pass bandwidth of the filter device is increased without addition of a new element.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
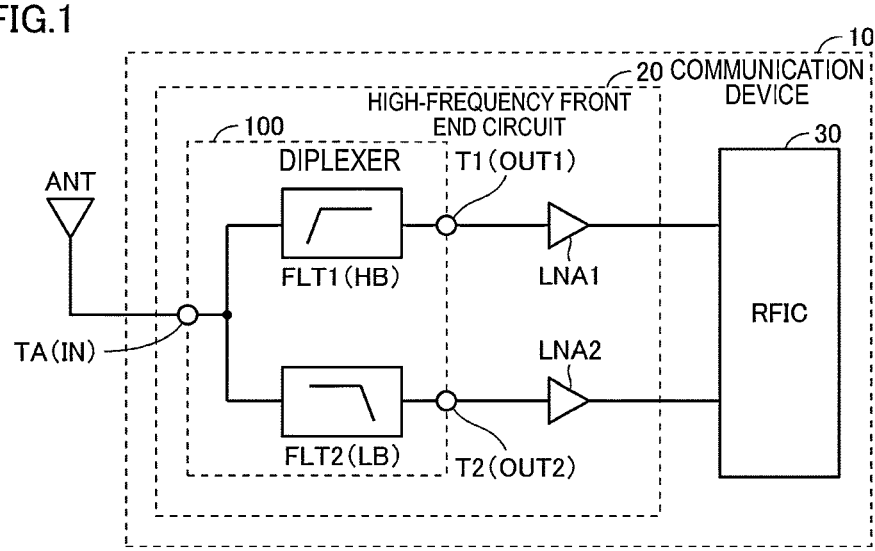
FIG. 1 is a block diagram illustrating a communication device including a high-frequency front end circuit to which a filter device of Preferred Embodiment 1 of the present invention is applied.

Hereinbelow, preferred embodiments of the present disclosure will be described in detail with reference to the drawings. Incidentally, identical or corresponding portions in the drawings are provided with identical reference characters and description thereof is not repeated.

Preferred Embodiment 1

Basic Configuration of Communication Device

FIG. 1 is a block diagram illustrating a communication device 10 including a high-frequency front end circuit 20 to which a filter device 100 according to an example embodiment is applied. The high-frequency front end circuit 20 causes high-frequency signals, received by an antenna device ANT, to branch into a plurality of predetermined frequency bands and transfers the signals to subsequent processing circuits. The high-frequency front end circuit 20 is used for a communication device such as a mobile terminal such as a cellular phone, a smartphone, or a tablet or a personal computer having a communication function, for instance.

With reference to FIG. 1, the communication device 10 includes the high-frequency front end circuit 20 including the filter device 100 and an RF signal processing circuit (which may be referred to as "RFIC" below) 30. The high-frequency front end circuit 20 illustrated in FIG. 1 is a receiving front end circuit. The high-frequency front end circuit 20 includes the filter device 100 and amplifier circuits LNA1, LNA2.

The filter device 100 is a diplexer including a filter FLT1 (first filter) and a filter FLT2 (second filter) that have different frequency ranges as pass bands. In following description, the filter device 100 may be referred to as a "diplexer".

The filter FLT1 is connected between an antenna terminal TA that is a common terminal and a first terminal T1. The filter FLT1 is a high pass filter having frequency ranges of a high-band (HB) group as pass bands and having frequency ranges of a low-band (LB) group as non-pass bands. The filter FLT2 is connected between the antenna terminal TA and a second terminal T2. The filter FLT2 is a low pass filter having frequency ranges of the low-band group as a pass band and having frequency ranges of the high-band group as a non-pass band. Incidentally, the filter FLT1 and the filter FLT2 may be band pass filters. The pass band of the filter FLT1 corresponds to "first frequency band" and the pass band of the filter FLT2 corresponds to "second frequency band".

Each of the filters FLT1, FLT2 allows only high-frequency signals corresponding to the pass band of the filter to pass therethrough among the high-frequency signals received by the antenna device ANT. Thus, the reception signals from the antenna device ANT are caused to branch into the signals of the plurality of predetermined frequency bands.

Each of the amplifier circuits LNA1, LNA2 is a so-called low noise amplifier. The amplifier circuits LNA1, LNA2 amplify the high-frequency signals having passed through the corresponding filters with low noises and transfer the signals to the RFIC 30.

The RFIC 30 is an RF signal processing circuit to process high-frequency signals that are transmitted or received by the antenna device ANT. Specifically, the RFIC 30 carries out signal processing by down-conversion or the like of high-frequency signals inputted from the antenna device ANT with a reception-side signal path of the high-frequency front end circuit 20 interposed therebetween and outputs reception signals generated by the signal processing to a baseband signal processing circuit (not illustrated).

On a condition that the high-frequency front end circuit 20 is used as a reception circuit as in FIG. 1, the antenna terminal TA becomes an input terminal IN and the first terminal T1 and the second terminal T2 respectively become a first output terminal OUT1 and a second output terminal OUT2, in the filter device 100. Meanwhile, the high-frequency front end circuit 20 can be used as a transmission circuit, as well. On this condition, each of the first terminal T1 and the second terminal T2 in the filter device 100 becomes an input terminal and the antenna terminal TA becomes a common output terminal. On that condition, power amplifiers are used as amplifiers included in the amplifier circuits.

Configuration of Filter Device

Figure 2:
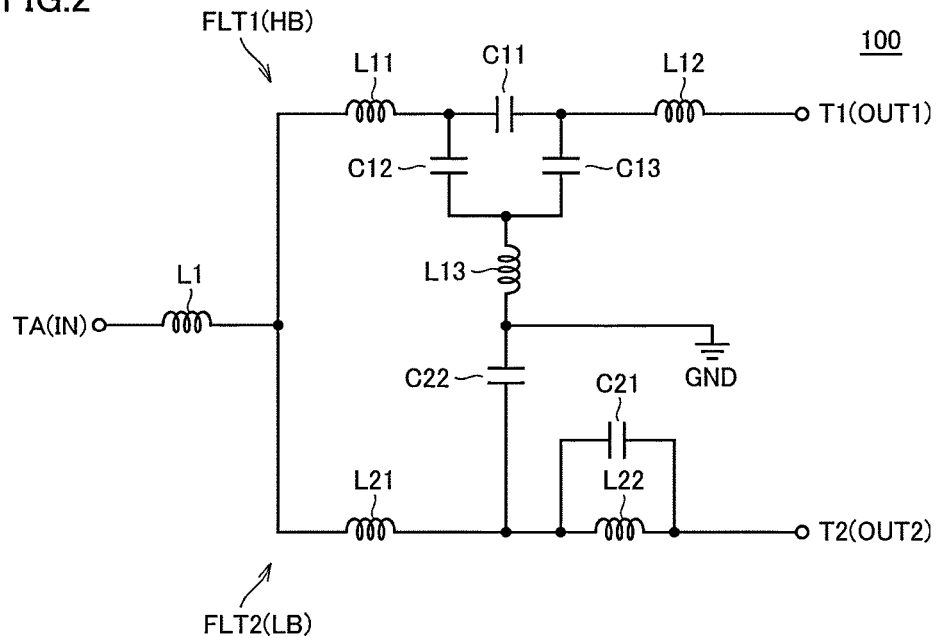
FIG. 2 is an equivalent circuit diagram of the filter device of Preferred Embodiment 1 of the present invention.

FIG. 2 is a diagram illustrating an equivalent circuit that is an example of the filter device (diplexer) 100 of FIG. 1. As described in relation to FIG. 1, the filter FLT1 is connected between the antenna terminal TA and the first terminal T1. Meanwhile, the filter FLT2 is connected between the antenna terminal TA and the second terminal T2. An inductor L1 is connected in common between the filters FLT1, FLT2 and the antenna terminal TA. The inductor L1 is used in order to adjust impedance between the antenna device ANT and the filter device 100.

The filter FLT1 includes inductors L11, L12, and a capacitor C11 that configure a series arm circuit and an inductor L13 and capacitors C12, C13 that configure a parallel arm circuit. The inductor L11 is connected to the inductor L1 and the inductor L12 is connected to the first terminal T1. The capacitor C11 is connected between the inductor L11 and the inductor L12.

One end of the capacitor C12 is connected to a connection node between the inductor L11 and the capacitor C11. The other end of the capacitor C12 is connected to a ground terminal GND with the inductor L13 interposed therebetween. One end of the capacitor C13 is connected to a connection node between the inductor L12 and the capacitor C11. The other end of the capacitor C13 is connected to the ground terminal GND with the inductor L13 interposed therebetween.

The filter FLT1 defines and functions as a resonator configured by the inductor L13 and the capacitors C12, C13 of the parallel arm circuit and the capacitor C11 and as a band pass filter as a result of the inductors L11, L12 defining and functioning as inductors to perform trapping.

The filter FLT2 includes inductors L21, L22 and a capacitor C21 that configure a serial arm circuit and a capacitor C22 that configures a parallel arm circuit. The inductor L21 has one end connected to the inductor L1 and the other end connected to the second terminal T2 with the inductor L22 interposed therebetween. The capacitor C21 is connected in parallel to the inductor L22. One end of the capacitor C22 is connected to a connection node between the inductor L21 and the inductor L22. The other end of the capacitor C22 is connected to the ground terminal GND.

In the example of the filter device 100 of Preferred Embodiment 1, the pass band of the filter FLT1 is set in a vicinity of about 2.4 GHz to about 10 GHz and the pass band of the filter FLT2 is set in a vicinity of about 0 GHz to about 1.6 GHz. In the filter device 100, therefore, the filter FLT1 defines and functions as the high pass filter.

Figure 3:
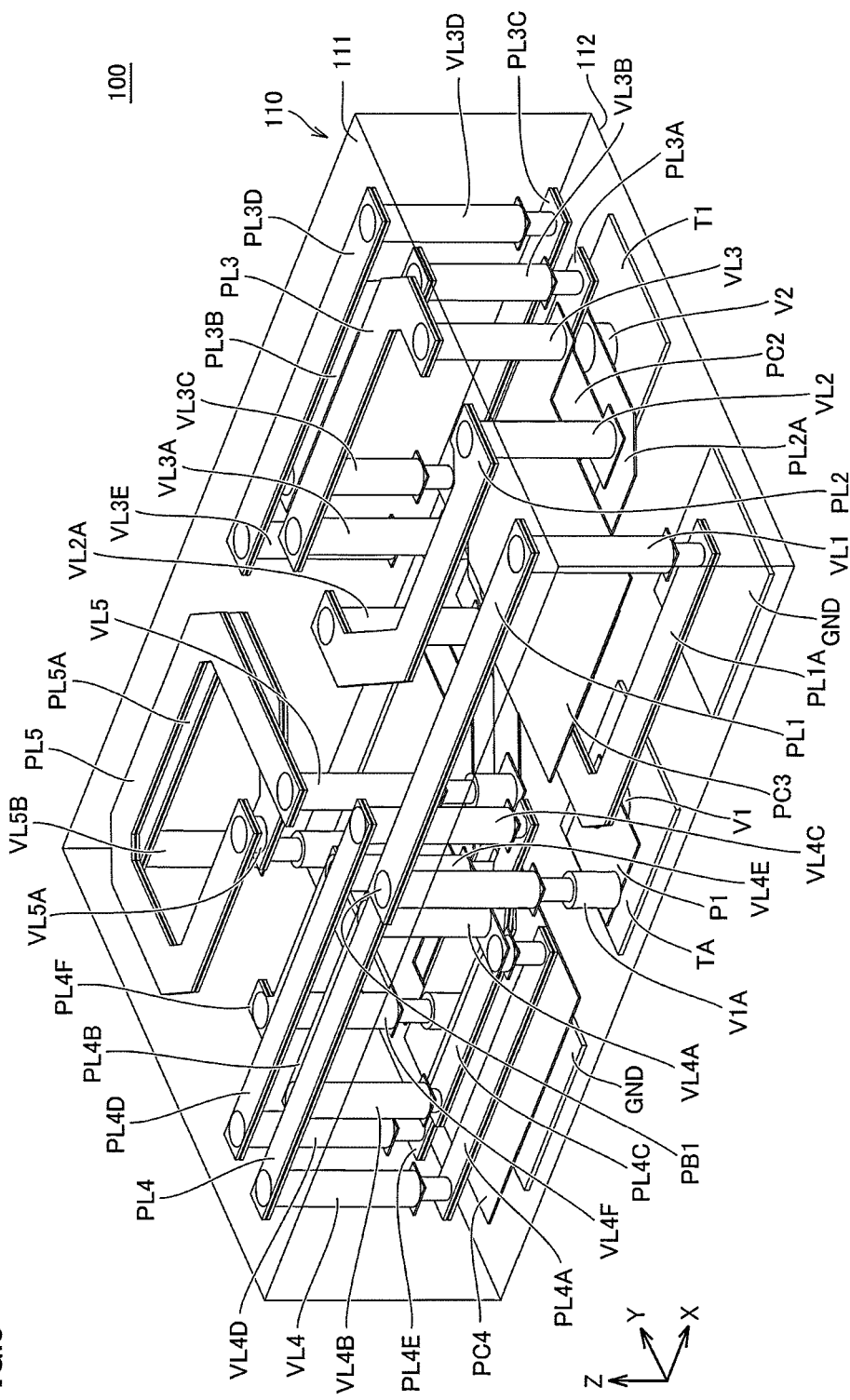
FIG. 3 is a perspective view illustrating an inner portion of the filter device of FIG. 2.
Figure 4:
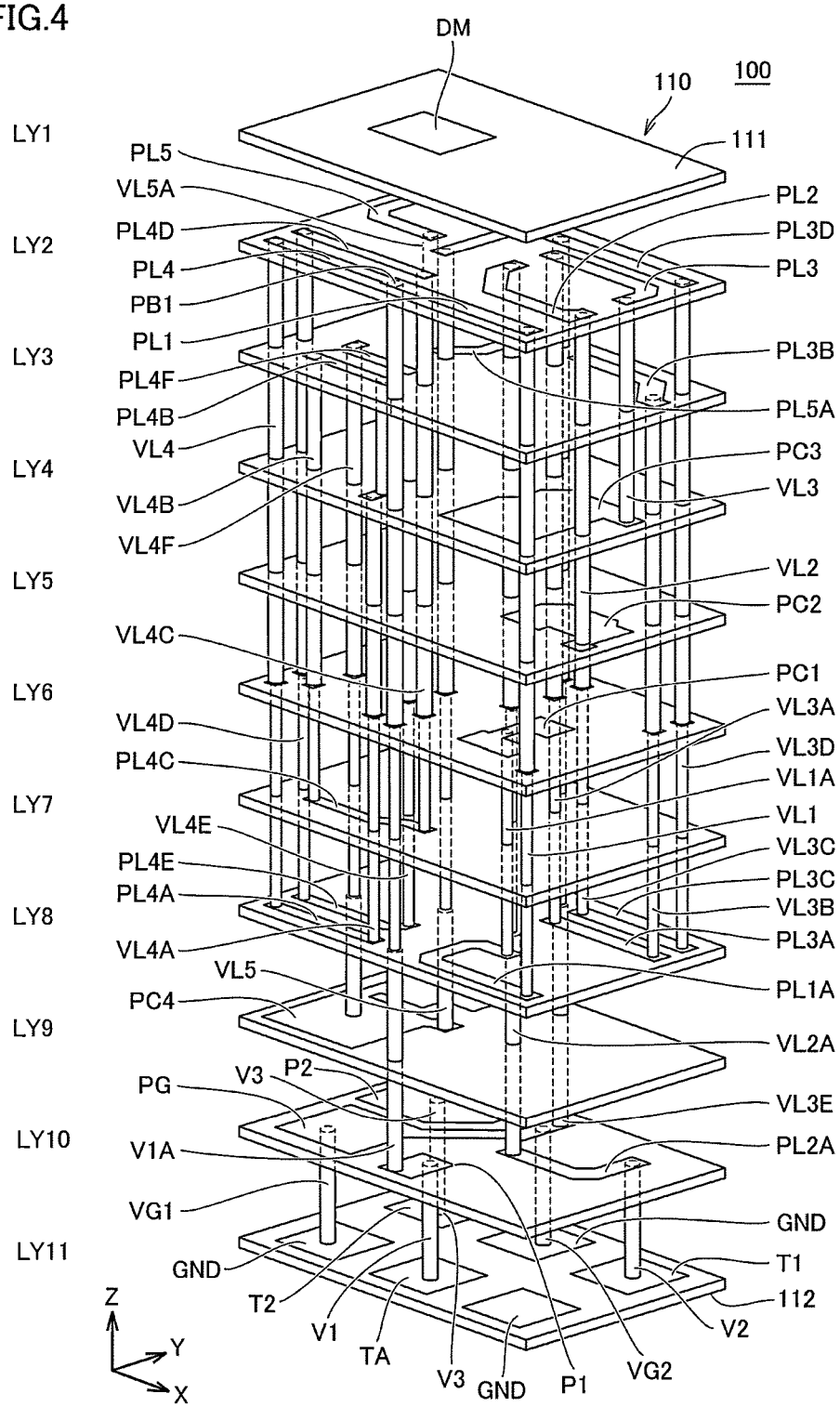
FIG. 4 is an exploded perspective view illustrating an example of a stacking structure of the filter device of FIG. 2.
Figure 5:
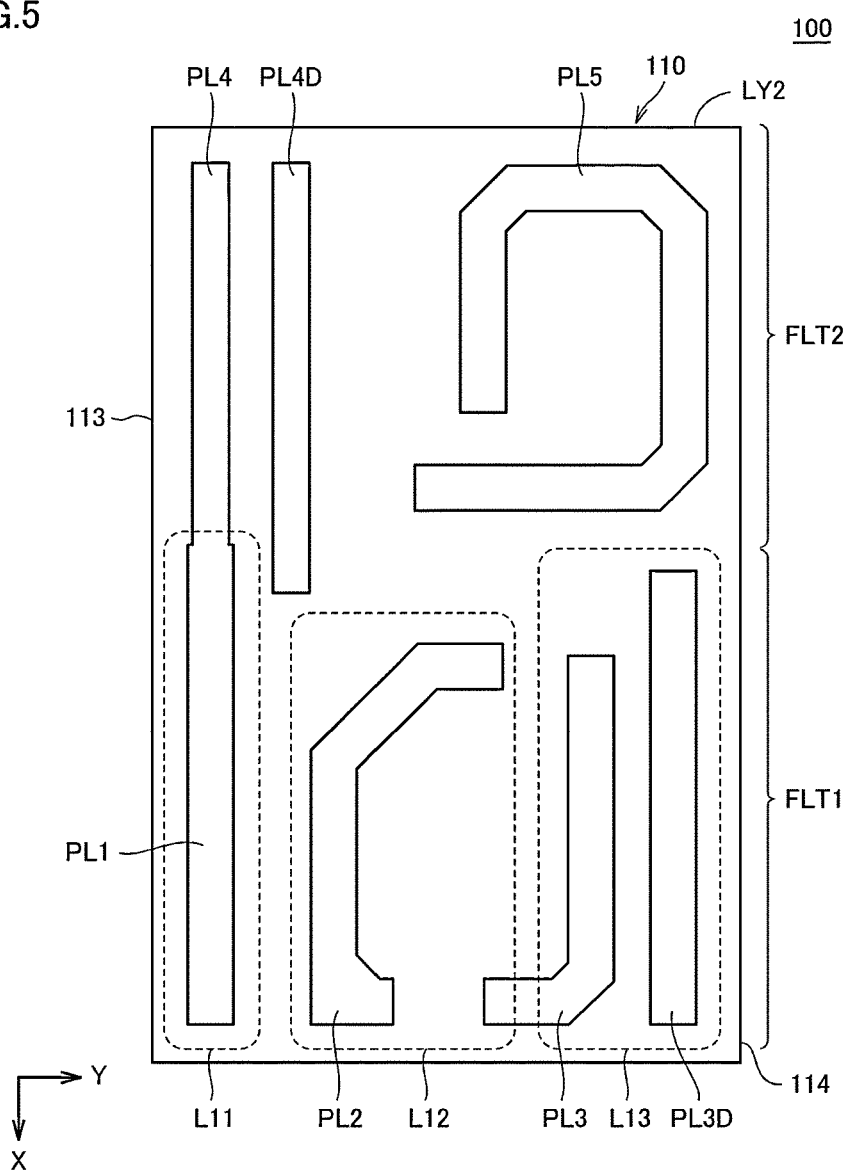
FIG. 5 is a diagram for description of placement of inductors in the filter device of FIG. 2.

Subsequently, details of an internal configuration of the filter device 100 will be described with use of FIGS. 3 to 5. FIG. 3 is a perspective view illustrating an inner portion of the filter device 100 of FIG. 2 and FIG. 4 is an exploded perspective view illustrating an example of a stacking structure of the filter device 100. Meanwhile, FIG. 5 is a diagram for description of placement of the inductors in the filter device 100 and, specifically, FIG. 5 is a plan view of a dielectric layer in FIG. 4.

With reference to FIGS. 3 and 4, the filter device 100 includes a main body 110 that is formed by stacking a plurality of dielectric layers LY1 to LY11 along a specified direction and that is in a shape of a rectangular parallelepiped or a substantially rectangular parallelepiped. The direction in which the plurality of dielectric layers LY1 to LY11 are stacked in the main body 110 will be referred to as a stacking direction. The dielectric layers of the main body 110 are each formed of a ceramic such as low temperature co-fired ceramics (LTCC), for instance, or resin. In an inner portion of the main body 110, the inductors and the capacitors that are to configure the filters FLT1, FLT2 are configured by a plurality of electrodes provided for the dielectric layers and a plurality of vias provided between the dielectric layers. In FIGS. 3 to 5, incidentally, dielectrics of the main body 110 are omitted and only conductors of wiring patterns, vias, and terminals that are provided in the inner portion are illustrated. Herein, "via" refers to a conductor that is provided in dielectric layers in order to connect electrodes provided for different dielectric layers. The vias may be made of conductive paste, plate, metal pins, and/or the like, for instance.

In following description, the stacking direction of the main body 110 will be referred to as "Z axis direction", a direction that is perpendicular or substantially perpendicular to Z axis direction and that extends along a long side of the main body 110 will be referred to as "X axis direction", and a direction that extends along a short side of the main body 110 will be referred to as "Y axis direction". Hereinbelow, meanwhile, a positive direction along Z axis direction in each drawing may be referred to as upper side and a negative direction therealong may be referred to as lower side.

A directional mark DM for identification of a direction of the filter device 100 is provided on a top surface 111 (dielectric layer LY1) of the main body 110. The antenna terminal TA, the first terminal T1, the second terminal T2, and the ground terminal GND that are external terminals for connection between the filter device 100 and external devices are provided on a bottom surface 112 (dielectric layer LY11) of the main body 110. The external terminals are electrodes shaped like flat plates and are land grid array (LGA) terminals positioned regularly on the bottom surface 112 of the main body 110. In the example illustrated in FIGS. 3 and 4, schematically, the filter FLT1 on a high band side is placed in a portion of the main body 110 on a right side (in a positive direction along X axis) and the filter FLT2 on a low band side is provided in a portion thereof on a left side (in a negative direction along X axis).

The inductor L1 that is a common element is configured by vias V1, V1A and a flat-plate electrode P1 from the antenna terminal TA placed on the bottom surface 112 (dielectric layer LY11) to a branch point PB1 of the dielectric layer LY2. As described in relation to FIG. 2, the inductor L11 of the filter FLT1 and the inductor L21 of the filter FLT2 are connected to the branch point PB1.

Initially, details of the filter FLT1 that is the high pass filter will be described. A linear flat-plate electrode PL1 extending from the branch point PB1 in the positive direction along X axis is connected to the branch point PB1. A via VL1 is connected to an end portion of the flat-plate electrode PL1. The flat-plate electrode PL1 is connected to one end of a flat-plate electrode PL1A provided for the dielectric layer LY8 with the via VL1 interposed therebetween. The flat-plate electrode PL1A is a band electrode shaped substantially like a letter J. A via VL1A is connected to the other end of the flat-plate electrode PL1A and the flat-plate electrode PL1A is connected to a capacitor electrode PC1 provided for the dielectric layer LY6 and shaped like a flat plate with the via VL1A interposed therebetween. The inductor L11 of FIG. 2 is configured by a path including the flat-plate electrode PL1, the via VL1, the flat-plate electrode PL1A, and the via VL1A.

In a plan view of the main body 110 from a normal direction, a portion of the capacitor electrode PC1 overlaps with a capacitor electrode PC2 provided for the dielectric layer LY5 and shaped like a flat plate. Meanwhile, another portion of the capacitor electrode PC1 overlaps with a capacitor electrode PC3 provided for the dielectric layer LY4 and shaped like a flat plate. Incidentally, the capacitor electrode PC3 overlaps with the capacitor electrode PC2 as well.

The capacitor C11 of FIG. 2 is configured by the capacitor electrode PC1 and the capacitor electrode PC2. Meanwhile, the capacitor C12 of FIG. 2 is configured by the capacitor electrode PC1 and the capacitor electrode PC3. Further, the capacitor C13 of FIG. 2 is configured by the capacitor electrode PC2 and the capacitor electrode PC3.

The capacitor electrode PC2 is connected by a via VL2 to one end of a band-shaped flat-plate electrode PL2 provided for the dielectric layer LY2. A via VL2A is connected to the other end of the flat-plate electrode PL2. The flat-plate electrode PL2 is connected by the via VL2A to one end of a band-shaped flat-plate electrode PL2A provided for the dielectric layer LY10. The flat-plate electrode PL2A substantially has a shape like a letter L and is connected to the first terminal T1 of the dielectric layer LY11 by a via V2 connected to the other end thereof. The inductor L12 of FIG. 2 is configured by a path including the via VL2, the flat-plate electrode PL2, the via VL2A, the flat-plate electrode PL2A, and the via V2.

The capacitor electrode PC3 is connected by a via VL3 to one end of a band-shaped flat-plate electrode PL3 provided for the dielectric layer LY2. A via VL3A is connected to the other end of the flat-plate electrode PL3. The flat-plate electrode PL3 is connected by the via VL3A to one end of a band-shaped flat-plate electrode PL3A provided for the dielectric layer LY8. The flat-plate electrode PL3A is a linear electrode extending in X axis direction and is connected by a via VL3B, connected to the other end thereof, to one end of a band-shaped flat-plate electrode PL3B provided for the dielectric layer LY3.

The flat-plate electrode PL3B is connected by a via VL3C, connected to the other end thereof, to one end of a band-shaped flat-plate electrode PL3C provided for the dielectric layer LY8. The flat-plate electrode PL3C is a linear electrode extending in X axis direction and is connected by a via VL3D, connected to the other end thereof, to one end of a band-shaped flat-plate electrode PL3D provided for the dielectric layer LY2. The flat-plate electrode PL3D is a linear electrode extending in X axis direction and is connected by a via VL3E, connected to the other end thereof, to a flat-plate electrode PG provided for the dielectric layer LY10. The flat-plate electrode PG is connected by vias VG1, VG2 to the ground terminal GND provided for the dielectric layer LY11.

The inductor L13 of FIG. 2 is configured by a path including the vias VL3 to VL3E, VG1, VG2 and the flat-plate electrodes PL3 to PL3D, PG. In the example of the filter device 100 of Preferred Embodiment 1, the inductors L11, L12, L13 that define the filter FLT1 are configured by vertical helical coils having winding axes along Y axis direction.

Subsequently, details of the filter FLT2 that is the low pass filter will be described. A linear flat-plate electrode PL4 extending from the branch point PB1 in the negative direction along X axis is connected to the branch point PB1. A via VL4 is connected to an end portion of the flat-plate electrode PL4. The flat-plate electrode PL4 is connected to one end of a flat-plate electrode PL4A provided for the dielectric layer LY8 with the via VL4 interposed therebetween. The flat-plate electrode PL4A is a linear electrode extending in X axis direction and is connected by a via VL4A, connected to the other end thereof, to a flat-plate electrode PL4B provided for the dielectric layer LY3. Incidentally, the via VL4A is slightly offset in Y axis direction in the dielectric layer LY4.

The flat-plate electrode PL4B is a linear electrode extending in X axis direction and is connected by a via VL4B, connected to the other end thereof, to one end of a band-shaped flat-plate electrode PL4C provided for the dielectric layer LY7. A via VL4C is connected to the other end of the flat-plate electrode PL4C. The flat-plate electrode PL4C is connected by the via VL4C to a flat-plate electrode PL4D provided for the dielectric layer LY2. The flat-plate electrode PL4D is a linear electrode extending in X axis direction and is connected by a via VL4D, connected to the other end thereof, to one end of a band-shaped flat-plate electrode PL4E provided for the dielectric layer LY8.

A via VL4E is connected to the other end of the flat-plate electrode PL4E. The flat-plate electrode PL4E is connected by the via VL4E to one end of a band-shaped flat-plate electrode PL4F provided for the dielectric layer LY3. A via VL4F is connected to the other end of the flat-plate electrode PL4F. The flat-plate electrode PL4F is connected by the via VL4F to a capacitor electrode PC4 provided for the dielectric layer LY9.

The inductor L21 of FIG. 2 is configured by a path including the flat-plate electrodes PL4 to PL4F and the vias VL4 to VL4F. The inductor L21 is a vertical helical coil having a winding axis along Y axis direction, as with the inductors of the filter FLT1.

In the plan view of the main body 110 from the normal direction, a portion of the capacitor electrode PC4 overlaps with the flat-plate electrode PG provided for the dielectric layer LY10. As described above, the flat-plate electrode PG is connected by the vias VG1, VG2 to the ground terminal GND. Therefore, the capacitor C22 of FIG. 2 is configured by the capacitor electrode PC4 and the flat-plate electrode PG.

In the plan view of the main body 110 from the normal direction, meanwhile, another portion of the capacitor electrode PC4 overlaps with the flat-plate electrode P2 provided for the dielectric layer LY10, as well. The flat-plate electrode P2 is connected by a via V3 to the second terminal T2 of the dielectric layer LY11. Therefore, the capacitor C21 of FIG. 2 is configured by the capacitor electrode PC4 and the flat-plate electrode P2.

The capacitor electrode PC4 is connected by a via VL5 to one end of a band-shaped flat-plate electrode PL5 provided for the dielectric layer LY2. A via VL5A is connected to the other end of the flat-plate electrode PL5. The flat-plate electrode PL5 is connected by the via VL5A to one end of a band-shaped flat-plate electrode PL5A provided for the dielectric layer LY3. A via VL5B is connected to the other end of the flat-plate electrode PL5A. The flat-plate electrode PL5A is connected by the via VL5B to the flat-plate electrode P2 provided for the dielectric layer LY10.

The inductor L22 of FIG. 2 is configured by the vias VL5 to VL5B and the flat-plate electrodes PL5, PL5A. The flat-plate electrodes PL5, PL5A each have a shape like a planar coil wound around the normal direction (Z axis direction) of the main body 110. Therefore, the flat-plate electrodes PL5, PL5A are configured as planar coils having winding axes along the Z axis direction.

As described above, FIG. 5 is the plan view of the dielectric layer LY2 in the filter device 100. In the filter device 100, as described in relation to FIGS. 3 and 4, the filter FLT1 as the high pass filter is configured in a lower portion (in the positive direction along X axis) in FIG. 5 in the main body 110 and the filter FLT2 as the low pass filter is configured in an upper portion (in the negative direction along X axis) in FIG. 5.

The inductors in the filter FLT are positioned in order of the inductors L11, L13, and L12 along a signal transfer path directed from the antenna terminal TA on an input side toward the first terminal T1 on an output side on the equivalent circuit illustrated in FIG. 2. Actual placement of the inductors in the main body 110, however, is in order of the inductors L11, L12, and L13 from a long side 113 of the main body 110 on a left side (in a negative direction along Y axis) toward a long side 114 thereof on a right side (in a positive direction along Y axis).

Figure 6:
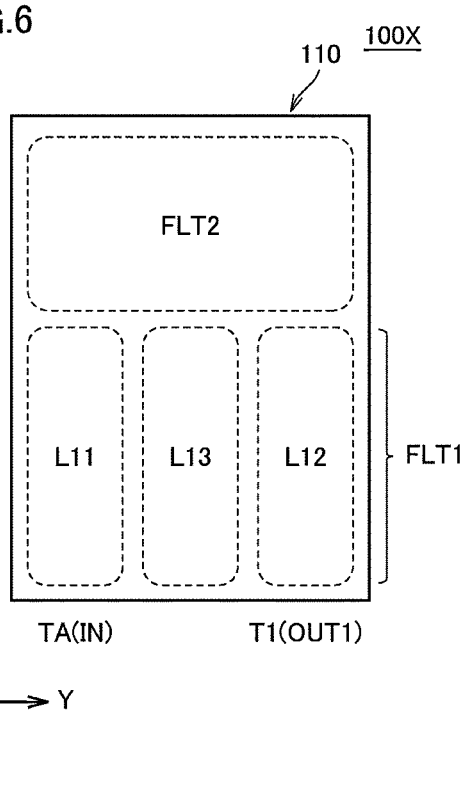
FIG. 6 is a diagram for description of placement of inductors of a high pass filter in a filter device of a comparative example.

In a conventional filter device, as illustrated in a filter device 100X of a comparative example of FIG. 6, a plurality of inductors forming an LC filter are typically placed in the same order as in the equivalent circuit from an input terminal (antenna terminal TA) toward an output terminal (first terminal T1) in an actual main body. That is, the inductor L13 is placed between the inductor L11 connected to the input terminal and the inductor L12 connected to the output terminal. In this case, a degree of magnetic coupling between the inductor L11 and the inductor L12 is comparatively weak because a distance between the inductor L11 and the inductor L12 is increased and because the inductor L13 is interposed therebetween.

The inventor discovered that, in such a band pass filter of the filter FLT1 as described above, a pass bandwidth of the band pass filter could be adjusted by alteration in a degree of magnetic coupling between an inductor for trapping on the input side and an inductor for trapping on the output side.

In such a configuration as of the filter device 100X of the comparative example of FIG. 6, however, the placement of the inductor L13 between the inductor L11 and the inductor L12 imposes a limitation on nearing between the inductor L11 and the inductor L12 and narrows an adjustment allowance therefor. In case where the distance between the inductor L11 and the inductor L12 is adjusted, additionally, resultant necessity to alter a position of the inductor L13 involves simultaneous alteration in a degree of coupling between the inductor L11 and the inductor L13 and in a degree of coupling between the inductor L12 and the inductor L13 and thus may influence other filter characteristics as well.

In the filter FLT1 of the filter device 100 of Preferred Embodiment 1, by contrast, adjacent positioning of the inductor L11 on the input side and the inductor L12 on the output side in the main body 110 facilitates a decrease in the distance between the inductor L11 and the inductor L12 and the magnetic coupling, compared with the configuration in which the inductors L11, L12 are placed at both ends of the main body as in the filter device 100x of the comparative example. Therefore, the adjustment allowance for the magnetic coupling between the inductor L11 and the inductor L12 is increased by adjustment of winding directions and/or numbers of winding of the inductors. Besides, it is unnecessary to alter placement of the inductor L13 when the degree of coupling between the inductor L11 and the inductor L12 is adjusted, and thus influence on other filter characteristics is decreased as well. In the filter device 100 of Preferred Embodiment 1, therefore, the adjustment allowance for the pass bandwidth of the filter device is increased by a comparatively simple configuration without addition of a new element.

Bandpass Characteristics

Figure 7:
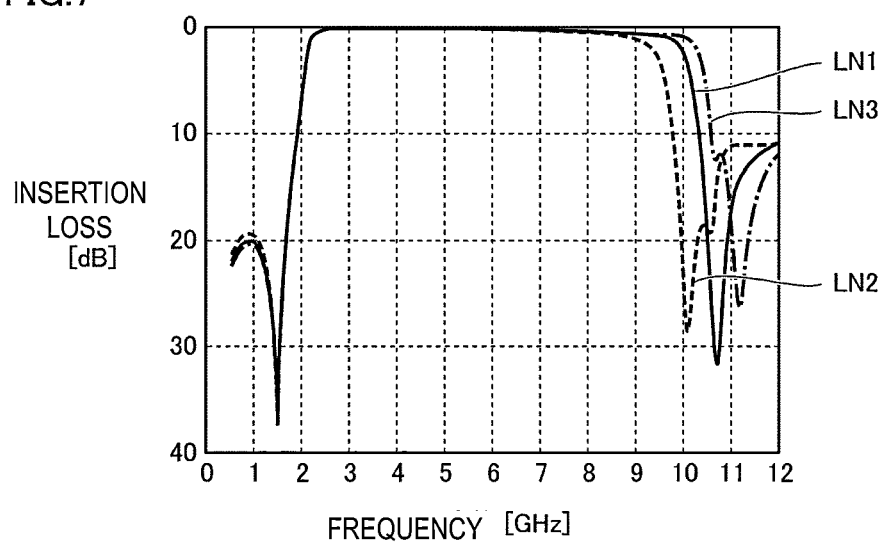
FIG. 7 is a diagram illustrating bandpass characteristics of the filter device of Preferred Embodiment 1 of the present invention.

FIG. 7 is a diagram illustrating bandpass characteristics of the filter FLT1 of the filter device 100 of Preferred Embodiment 1. In FIG. 7, a horizontal axis represents frequency and a vertical axis represents insertion loss of the filter FLT1.

In FIG. 7, under a condition that the winding directions of the inductor L11 and the inductor L12 are the same (that is, directions of generated magnetic fields are the same), the insertion loss with placement of the inductor L12 at a specified reference distance from the inductor L11 is denoted by a solid line LN1, the insertion loss with the inductor L12 being nearer to the inductor L11 than the reference distance is denoted by a dashed line LN2, and the insertion loss with the inductor L12 being farther from the inductor L11 than the reference distance is denoted by a dot and dash line LN3.

As illustrated in FIG. 7, under a condition that the winding directions of the two inductors are opposite, nearing of the inductors (that is, weakening of the degree of magnetic coupling) causes a shift in a position of an attenuation pole on a higher frequency side of the pass band to a lower frequency side and narrows the pass bandwidth. By contrast, distancing of the inductors (that is, strengthening of the degree of magnetic coupling) causes a shift in the position of the attenuation pole on the higher frequency side of the pass band to a higher frequency side and broadens the pass bandwidth. Incidentally, no major changes are found in attenuation and steepness of attenuation in the non-pass band even though the distance between the inductor L11 and the inductor L12 is altered.

Therefore, the adjustment allowance for the pass bandwidth can be increased while the influence on other filter characteristics is decreased, by the adjacent positioning of the inductor connected to the input terminal and the inductor connected to the output terminal in the main body as in the filter FLT1 of the filter device 100.

Incidentally, under a condition that the winding directions of the two inductors are the same, the nearing of the inductors strengthens the degree of magnetic coupling and causes a shift in the position of the attenuation pole on the higher frequency side of the pass band to the higher frequency side. By contrast, the distancing of the inductors weakens the degree of magnetic coupling and causes a shift in the position of the attenuation pole on the higher frequency side of the pass band to the lower frequency side.

Modification

Though the configuration in which the inductors of the filter FLT1 are inductors having the winding axes along Y axis direction has been described in relation to Preferred Embodiment 1 described above, the inductors may be configured as inductors having winding axes along the Z axis direction, as with the inductor L22 of the filter FLT2.

Figure 8:
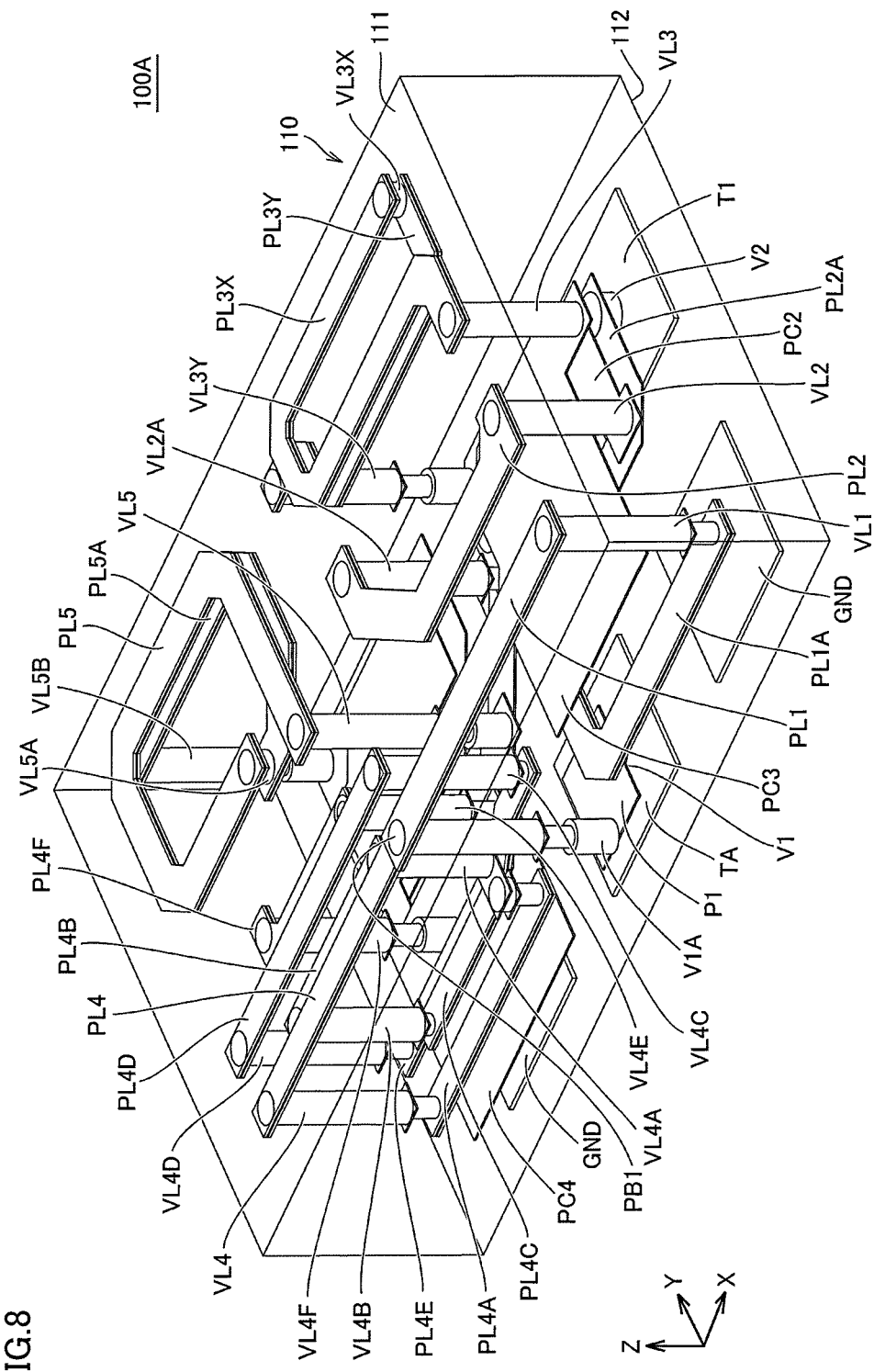
FIG. 8 is a perspective view illustrating an inner portion of a filter device of a modification.

FIG. 8 is a perspective view illustrating an inner portion of a filter device 100A of a modification of an example embodiment of the present disclosure. In the filter device 100A, the inductor L13 connected to the ground terminal GND includes a planar coil having a winding axis along Z axis direction. As for FIG. 8, incidentally, descriptions of elements overlapping with FIGS. 3 and 4 are not repeated.

With reference to FIG. 8, the via VL3 connected to the capacitor electrode PC3 of the dielectric layer LY4 is connected to one end of a band-shaped flat-plate electrode PL3X provided for the dielectric layer LY2. The flat-plate electrode PL3X substantially has a shape like a letter U and has the other end connected by a via VL3X to one end of a band-shaped flat-plate electrode PL3Y provided for the dielectric layer LY3. The other end of the flat-plate electrode PL3Y is connected by a via VL3Y to the flat-plate electrode PG of the dielectric layer LY10 and is connected to the ground terminal GND with the vias VG1, VG2 interposed therebetween.

Thus, even if an inductor includes a planar coil having a winding axis along Z axis direction, the adjustment allowance for the pass bandwidth can be increased while the influence on other filter characteristics is decreased, by the adjacent positioning of the inductor connected to the input terminal and the inductor connected to the output terminal in the main body.

Though the example of the filter device 100A above in which the inductor L13 includes the planar coil having the winding axis along Z axis direction has been described, incidentally, a configuration in which the inductor L11 and/or the inductor L12 includes a planar coil having a winding axis along Z axis direction may be used. That is, at least one of the inductors of the filter FLT1 may include the planar coil having the winding axis along Z axis direction.

Incidentally, "inductor L11", "inductor L12", and "inductor L13" in Preferred Embodiment 1 respectively correspond to "first inductor", "second inductor", and "third inductor". "Capacitor C11", "capacitor C12", and "capacitor C13" in Preferred Embodiment 1 respectively correspond to "first capacitor", "second capacitor", and "third capacitor".

Preferred Embodiment 2

Though the examples in which the filter device is a diplexer have been described in relation to Preferred Embodiment 1 and the modification, characteristics of the present disclosure can be applied to a filter device including a single filter.

Figure 9:
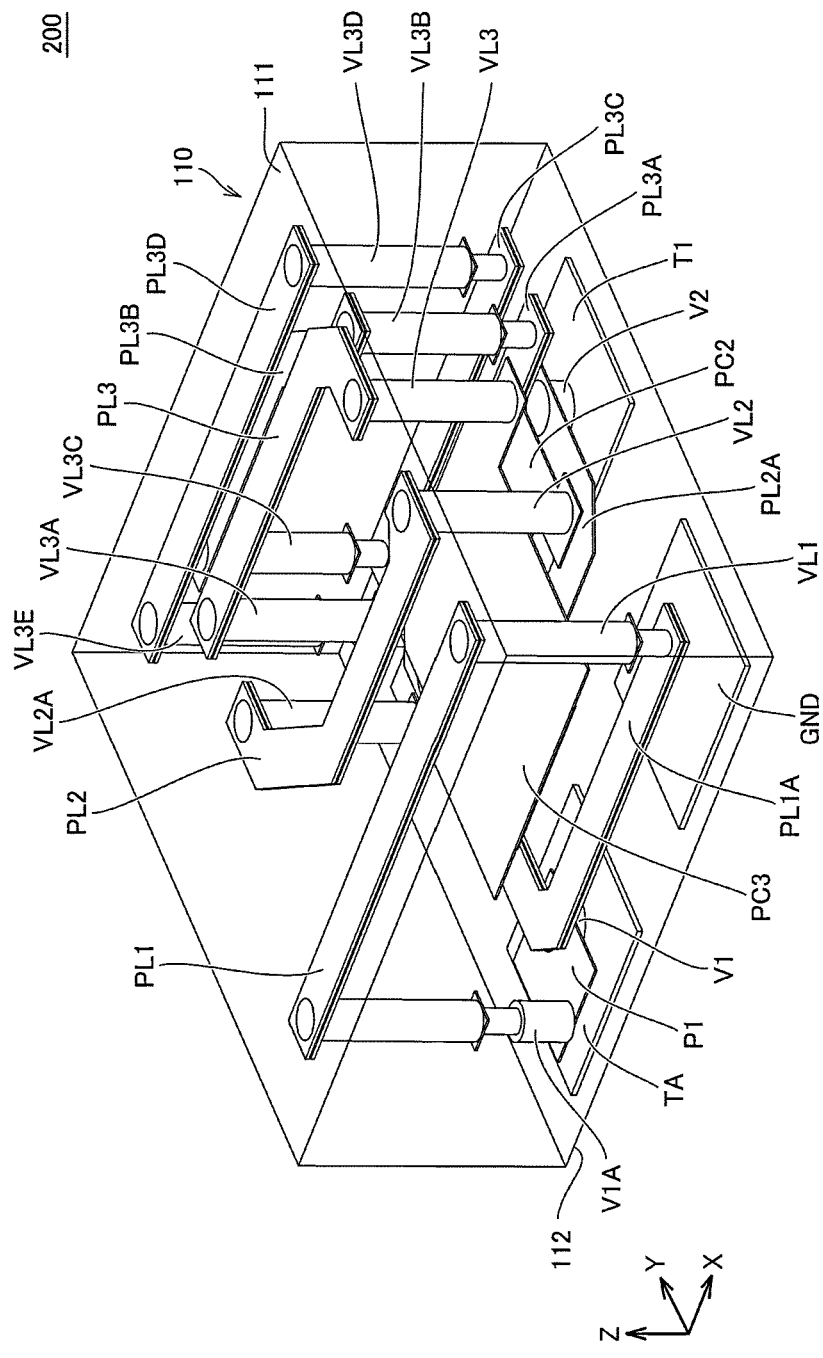
FIG. 9 is a perspective view illustrating an inner portion of a filter device of Preferred Embodiment 2 of the present invention.
Figure 10:
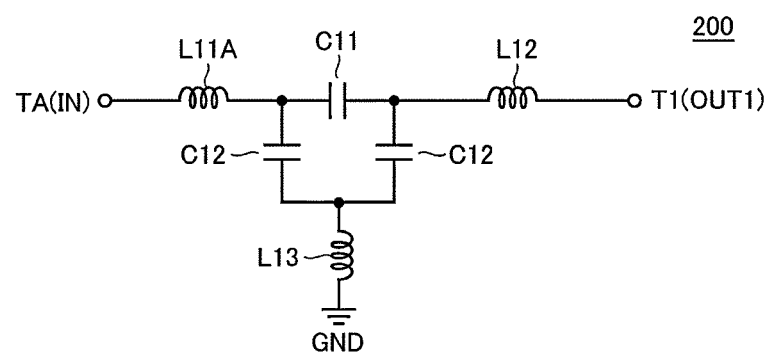
FIG. 10 is an equivalent circuit diagram of the filter device of FIG. 9.

FIG. 9 is a perspective view illustrating an inner portion of a filter device 200 of Preferred Embodiment 2. Meanwhile, FIG. 10 is an equivalent circuit diagram of the filter device 200. The filter device 200 is a band pass filter configured by only the filter FLT1 of the filter device 100 of Preferred Embodiment 1.

In the filter device 200, with reference to FIGS. 9 and 10, an inductor L11A is connected instead of the inductor L11 to the antenna terminal TA. In the filter device 100 of Preferred Embodiment 1, the vias V1, V1A and the flat-plate electrode P1 from the antenna terminal TA to the branch point PB1 function as the inductor L1 that is a common line for the filters FLT1, FLT2. The filter device 200, however, is a single band pass filter and thus a configuration in which the inductor L1 and the inductor L11 are connected in series is replaced by the inductor L11A in the equivalent circuit. The other configurations are the same as those of corresponding portions of Preferred Embodiment 1 in FIGS. 2 and 3 and detailed description thereof is not repeated.

In such a filter device including a single filter as well, the adjustment allowance for the pass bandwidth can be increased while the influence on other filter characteristics is decreased, by the adjacent positioning of the inductor connected to the input terminal and the inductor connected to the output terminal in the main body.

Preferred Embodiment 3

In relation to Preferred Embodiment 1 and Preferred Embodiment 2, the configuration examples in which the filter FLT1 includes one LC resonator and the two inductors for trapping and includes the three inductors L11 to L13 have been described. For adjustment of attenuation characteristics by addition of an attenuation pole, however, more inductors may be included in the filter.

In relation to Preferred Embodiment 3, an example of a filter in which two LC resonators are connected to a signal transfer path between an inductor connected to an input terminal and an inductor connected to an output terminal and which includes four inductors in total will be described.

Figure 11:
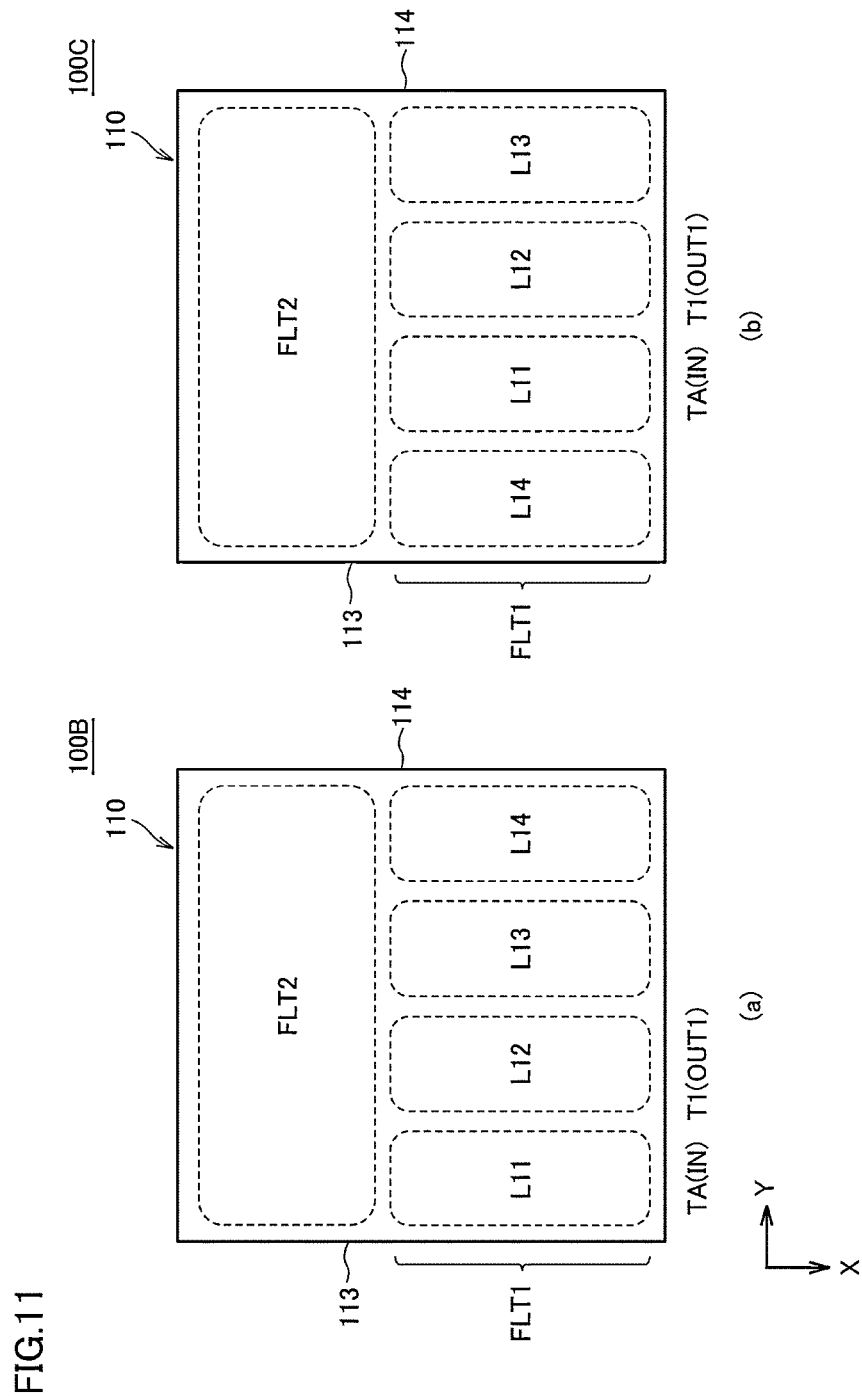
FIG. 11 is a diagram for description of placement of inductors in a filter device of Preferred Embodiment 3 of the present invention.

FIG. 11 is a diagram for description of placement of inductors included in a high pass filter in filter devices 100B, 100C according to Preferred Embodiment 3. FIG. 11 is a schematic plan view of the main body 110 from the normal direction.

In each of the filter devices 100B, 100C, with reference to FIG. 11, the signal transfer path between the inductor L11 and the inductor L12 is provided with an additional LC resonant circuit including an inductor L14, in addition to a resonator including the inductor L13. That is, the inductors L11, L13, L14, and L12 or the inductors L11, L14, L13, and L12 are positioned in order of mention along the signal transfer path directed from the antenna terminal TA toward the first terminal T1 in the equivalent circuit.

In the filter device 100B, however, the four inductors are positioned in order of the inductors L11, L12, L13, and L14 from the long side 113 of the main body 110 toward the long side 114 thereof. That is, the inductor L12 connected to the output terminal is positioned between the inductor L11 and the inductor L13 and between the inductor L11 and the inductor L14, and the inductor L11 and the inductor L12 are placed so as to be adjacent to each other.

In the filter device 100C, meanwhile, the four inductors are positioned in order of the inductors L14, L11, L12, and L13 from the long side 113 of the main body 110 toward the long side 114 thereof. That is, the inductor L11 connected to the input terminal is positioned between the inductor L14 and the inductor L12, and the inductor L11 and the inductor L12 are positioned to be adjacent to each other.

As for the filter including the four inductors as well, in this manner, the adjustment allowance for the pass bandwidth can be increased while the influence on other filter characteristics is decreased, by the adjacent positioning of the inductor connected to the input terminal and the inductor connected to the output terminal in the main body, as with Preferred Embodiments 1 and 2.

On the condition that four or more inductors are included in the filter, incidentally, the inductor L11 and the inductor L12 do not have to be directly adjacent unless both the inductor L11 and the inductor L12 are located at the respective ends of the main body. With such positioning in order of the inductors L11, L14, L12, and L13 from the long side 113 of the main body 110 toward the long side 114 thereof, specifically, the adjustment allowance for the pass bandwidth can be improved because the distance between the inductor L11 and the inductor L12 can be shortened compared with positioning of the inductor L11 and the inductor L12 at the respective ends (in order of the inductors L11, L13, L14, and L12).

"Inductor L14" in Preferred Embodiment 3 corresponds to "fourth inductor".

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device to transfer signals from an input terminal to an output terminal, the filter device comprising:
   a main body; and
   a first inductor, a second inductor, and a third inductor that are provided in the main body; wherein
   the first inductor is connected to the input terminal;
   the second inductor is connected to the output terminal;
   the first inductor and the second inductor are arranged in series in a signal transfer path connecting the input terminal and the output terminal;
   one end of the third inductor is connected to the signal transfer path between the first inductor and the second inductor; and
   the first inductor and the second inductor are adjacent to each other in a plan view from a normal direction of the main body.

2. The filter device according to claim 1, wherein the second inductor is between the first inductor and the third inductor, in the plan view from the normal direction of the main body.

3. The filter device according to claim 1, wherein the second inductor is magnetically coupled to the first inductor and the third inductor.

4. The filter device according to claim 1, wherein at least one of the first inductor, the second inductor, and the third inductor includes at least one flat-plate electrode and a via connected to the flat-plate electrode.

5. The filter device according to claim 1, wherein at least one of the first inductor, the second inductor, and the third inductor includes a planar coil including a winding axis along the normal direction of the main body.

6. The filter device according to claim 1, further comprising:
   a fourth inductor provided in the main body and connected to the signal transfer path between the first inductor and the second inductor; wherein
   the second inductor is between the first inductor and the fourth inductor in the plan view from the normal direction of the main body.

7. The filter device according to claim 1, further comprising:
   a fourth inductor provided in the main body and connected to the signal transfer path between the first inductor and the second inductor; wherein
   the first inductor is between the second inductor and the fourth inductor in the plan view from the normal direction of the main body.

8. The filter device according to claim 1, further comprising:
   a first capacitor connected to the first inductor and the second inductor;
   a second capacitor connected to the first inductor and the third inductor; and
   a third capacitor connected to the second inductor and the third inductor.

9. A high-frequency front end circuit comprising: the filter device according to claim 1.

10. The high-frequency front end circuit according to claim 9, wherein the second inductor is between the first inductor and the third inductor, in the plan view from the normal direction of the main body.

11. The high-frequency front end circuit according to claim 9, wherein the second inductor is magnetically coupled to the first inductor and the third inductor.

12. The high-frequency front end circuit according to claim 9, wherein at least one of the first inductor, the second inductor, and the third inductor includes at least one flat-plate electrode and a via connected to the flat-plate electrode.

13. The high-frequency front end circuit according to claim 9, wherein at least one of the first inductor, the second inductor, and the third inductor includes a planar coil including a winding axis along the normal direction of the main body.

14. The high-frequency front end circuit according to claim 9, further comprising:
    a fourth inductor provided in the main body and connected to the signal transfer path between the first inductor and the second inductor; wherein
    the second inductor is between the first inductor and the fourth inductor in the plan view from the normal direction of the main body.

15. The high-frequency front end circuit according to claim 9, further comprising:
    a fourth inductor provided in the main body and connected to the signal transfer path between the first inductor and the second inductor; wherein
    the first inductor is between the second inductor and the fourth inductor in the plan view from the normal direction of the main body.

16. The high-frequency front end circuit according to claim 9, further comprising:
    a first capacitor connected to the first inductor and the second inductor;
    a second capacitor connected to the first inductor and the third inductor; and
    a third capacitor connected to the second inductor and the third inductor.

17. A diplexer comprising:
    a first filter to allow signals in a first frequency band to pass therethrough; and
    a second filter to allow signals in a second frequency band that is lower than the first frequency band to pass therethrough; wherein
    the first filter is defined by the filter device according to claim 1.

18. The diplexer according to claim 17, wherein the second inductor is between the first inductor and the third inductor, in the plan view from the normal direction of the main body.

19. The diplexer according to claim 17, wherein the second inductor is magnetically coupled to the first inductor and the third inductor.

20. The diplexer according to claim 17, wherein at least one of the first inductor, the second inductor, and the third inductor includes at least one flat-plate electrode and a via connected to the flat-plate electrode.

* * * * *